United States Patent
Belgal et al.

(10) Patent No.: US 8,650,353 B2
(45) Date of Patent: Feb. 11, 2014

(54) APPARATUS, SYSTEM, AND METHOD FOR REFRESHING NON-VOLATILE MEMORY

(75) Inventors: Hanmant P. Belgal, El Dorado Hills, CA (US); Xin Guo, San Jose, CA (US); Sai Krishna Mylavarapu, Folsom, CA (US); Neal R. Mielke, Los Altos Hills, CA (US)

(73) Assignee: Intel Corporation, Santa Clara, CA (US)

( * ) Notice: Subject to any disclaimer, the term of this patent is extended or adjusted under 35 U.S.C. 154(b) by 220 days.

(21) Appl. No.: 13/174,926

(22) Filed: Jul. 1, 2011

(65) Prior Publication Data

US 2013/0007344 A1    Jan. 3, 2013

(51) Int. Cl.
G11C 16/34 (2006.01)
G06F 12/02 (2006.01)

(52) U.S. Cl.
CPC ........ *G11C 16/3431* (2013.01); *G06F 12/0246* (2013.01)
USPC .............. 711/103; 711/E12.008; 365/222

(58) Field of Classification Search
None
See application file for complete search history.

(56) References Cited

U.S. PATENT DOCUMENTS

| | | | | |
|---|---|---|---|---|
| 5,818,762 | A * | 10/1998 | Maari et al. | 365/185.25 |
| 6,396,744 | B1 * | 5/2002 | Wong | 365/185.25 |
| 6,781,908 | B1 * | 8/2004 | Pelley et al. | 365/222 |
| 7,325,090 | B2 * | 1/2008 | Ronen | 711/106 |
| 7,808,834 | B1 * | 10/2010 | Sutardja | 365/185.25 |
| 2004/0103238 | A1 * | 5/2004 | Avraham et al. | 711/102 |
| 2005/0201153 | A1 * | 9/2005 | Swaminathan | 365/185.11 |
| 2005/0243626 | A1 * | 11/2005 | Ronen | 365/222 |
| 2006/0039196 | A1 * | 2/2006 | Gorobets et al. | 365/185.01 |
| 2007/0253242 | A1 * | 11/2007 | Parkinson et al. | 365/163 |
| 2008/0005456 | A1 * | 1/2008 | Watanabe et al. | 711/106 |
| 2008/0013411 | A1 * | 1/2008 | Thorp et al. | 369/30.01 |
| 2008/0025063 | A1 * | 1/2008 | Kang | 365/145 |
| 2009/0161466 | A1 * | 6/2009 | Hamilton et al. | 365/222 |
| 2010/0058018 | A1 * | 3/2010 | Kund et al. | 711/167 |
| 2010/0157671 | A1 * | 6/2010 | Mokhlesi | 365/185.03 |
| 2010/0313084 | A1 * | 12/2010 | Hida et al. | 714/704 |
| 2010/0332943 | A1 * | 12/2010 | D'Abreu et al. | 714/763 |
| 2012/0278533 | A1 * | 11/2012 | Suzuki et al. | 711/103 |

FOREIGN PATENT DOCUMENTS

| | | | | | |
|---|---|---|---|---|---|
| JP | 07220485 | A | * | 8/1995 | G11C 16/06 |
| JP | 2000011670 | A | * | 1/2000 | G11C 16/02 |

OTHER PUBLICATIONS

John L. Hennessy and David A. Patterson. Computer Organization and Design. 1998. Morgan Kaufmann. pp. 10-13 and 109-115.*

* cited by examiner

*Primary Examiner* — Nathan Sadler
(74) *Attorney, Agent, or Firm* — Blakely, Sokoloff, Taylor & Zafman LLP (57) ABSTRACT

Described herein are an apparatus, system, and method for refreshing a non-volatile memory. The method comprises loading a time stamp, corresponding to data in a data location of a non-volatile memory, to a register; determining an elapsed time, corresponding to the data in the data location, according to the loaded time stamp; and refreshing data of the data location for which it is determined that the elapsed time exceeds a refresh time associated with the non-volatile memory.

23 Claims, 5 Drawing Sheets

APPARATUS, SYSTEM, AND METHOD FOR REFRESHING NON-VOLATILE MEMORY

FIELD OF THE INVENTION

Embodiments of the invention relate generally to the field of non-volatile memories. More particularly, embodiments of the invention relate to an apparatus, system, and method for refreshing a non-volatile memory.

BACKGROUND

Non-volatile memories are susceptible to data retention degradation caused by, for example, intrinsic charge loss (ICL) and stress-induced leakage (SILC). The term "data retention degradation" herein refers to corruption or toss of data in the non-volatile memory. It also refers to reduction in retention time limit associated with the non-volatile memory. Data retention degradation is exacerbated as the number of program erase cycles increase. The term "program erase cycles" refers to periods of time when data in the non-volatile memory is deleted or replaced with new data.

Data retention degradation is also exacerbated with heavy usage of the non-volatile memory e.g., sequences of high work loads followed by time periods when the non-volatile memory is idle and retaining data. During the time the non-volatile memory is idle, the data in the non-volatile memory can only be obtained for a finite amount of time. The term "idle" herein refers to duration when a data location in the non-volatile memory is written with data and before the data location is re-written with new data or erased. This finite amount of time beyond which data in the idle non-volatile memory corrupts or is lost is referred to herein as "retention time limit."

The data loss caused by data retention degradation results in unacceptably high uncorrectable bit error rate. System level solutions to resolve data retention degradation, such as wear-leveling, require complicated logic units to reduce the number of program-erase cycles that any block of the non-volatile memory experiences for a given workload. However, with wear-leveling the non-volatile memory may continue to experience a fixed number of program erase cycles per data location.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to an apparatus, system, and method for refreshing a non-volatile memory. In one embodiment, the apparatus automatically refreshes data in the non-volatile memory before the retention time limit even when the non-volatile memory is idle. The technical effect of the automatic refresh as discussed herein is improvement in the reliability (i.e., extension in useable life) of the non-volatile memory, reduction in cost to time-to-market the non-volatile memory because of simplified logic for refreshing the non-volatile memory, and seating (i.e., more memory storage per silicon area) of the technology on which the non-volatile memory is manufactured because more bits of data can now be stored in the non-volatile memory in view of the automatic refresh.

The term "retention time limit" refers to the time beyond which data in an idle non-volatile memory corrupts or is lost i.e., data in the non-volatile memory should be valid (uncorrupted) at least up to the retention time limit. Retention time limit for a particular non-volatile memory is identified in a technical specification data sheet published by the manufacturer of the non-volatile memory. In one embodiment, the retention time limit associated with the non-volatile memory is computed by determining when data in a data location of the non-volatile memory corrupts or is lost (i.e., becomes invalid) for an operating voltage, temperature, typical memory usage (activity factor), and process technology of the non-volatile memory.

The term "automatically" herein refers to background data refresh (BDR) which is independent of host system (e.g., personal computer, server, laptop, etc.) requests such that data, in the non-volatile memory, which is stored in a particular data location of the non-volatile memory is relocated to a new (free) data location in the non-volatile memory independent of the host processor, operating system, or host system (e.g., personal computer, server, laptop, etc.) requests.

The embodiments of the invention result in a simple data refresh mechanism that does not require the overhead of wear-leveling methods. In one embodiment, the apparatus, system, and method for automatically refreshing the data in the non-volatile memory are used in conjunction with traditional data retention degradation minimizing methods such as wear-leveling. In one embodiment, the non-volatile memory is partitioned into smaller memory units for the purpose of keeping track of elapsed time.

The term "elapsed time" herein refers to the cumulative time, associated with a data (or data location) on the non-volatile memory, which includes the time from when the data is written to the non-volatile memory to the time the non-volatile memory powers down or if the data is erased before the non-volatile memory powers down. The elapsed time also includes time, associated with the data (or data location), accumulated upon every power-up event to every power-down event of the non-volatile memory. In one embodiment, the apparatus tracks the elapsed time for each data location in the non-volatile memory to identify how long the data has been stored in the data location when the non-volatile memory is powered-up. In one embodiment, when the elapsed time becomes greater than a refresh time associated with the non-volatile memory, then the apparatus refreshes the data.

The term "refresh time" herein refers to a time which is less than the retention time limit or equal to the retention time limit, and is the time when the data in the non-volatile memory is refreshed. The term "refresh" herein refers to relocating data from a data location in the non-volatile memory to a new (free) data location in the non-volatile memory, and resetting the elapsed time to zero corresponding to the data in the new (free) data location. The term "new data location" herein refers to data location in the non-volatile memory which is free and available to be written.

The term "relocating" herein refers to moving the original data from a data location in the memory unit of the non-volatile memory to a new (free) data location in the non-volatile memory, and erasing the original data from the old data location of the non-volatile memory. Once the original data is erased, the old data location which contained the original data is now part of the memory unit corresponding to new (free) data locations.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

Figure 1:
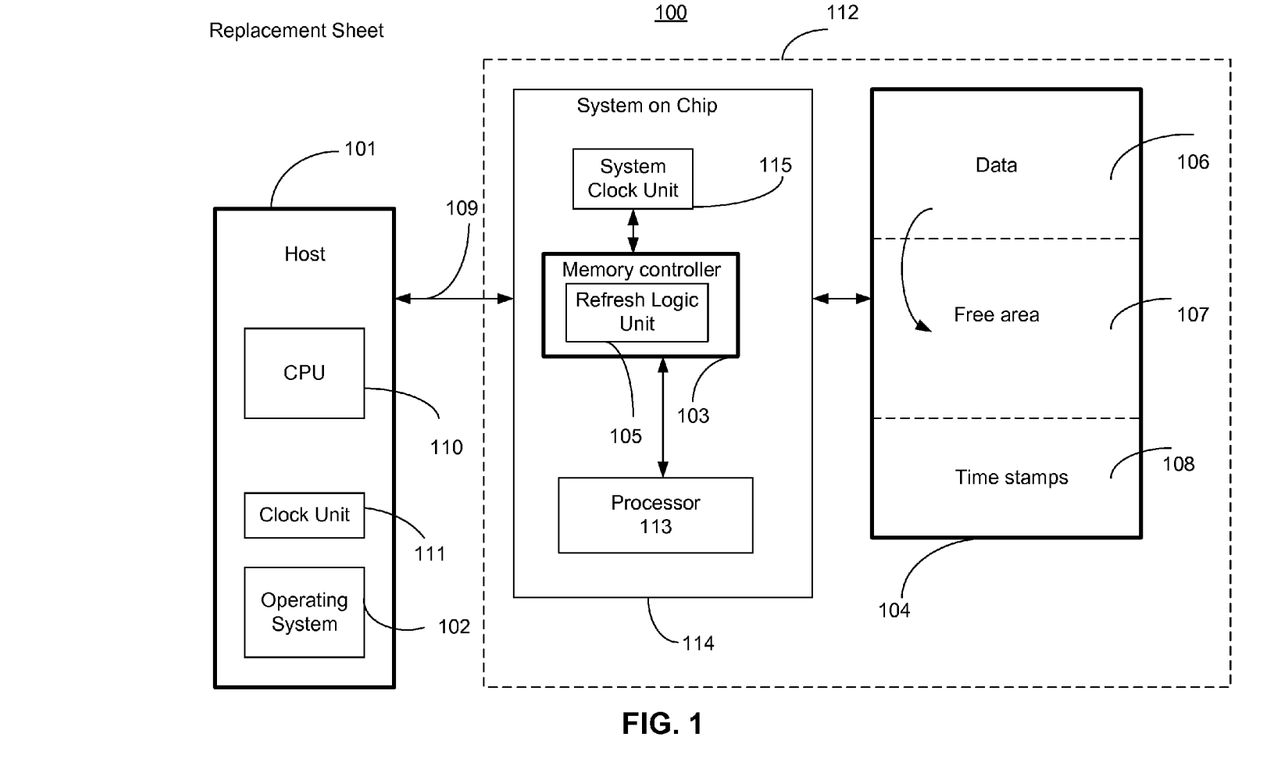
FIG. 1 is a high level system with nonvolatile memory which is operable to be automatically refreshed, according to one embodiment of the invention.

FIG. 1 is a high level system 100 with a non-volatile memory 104 which is operable to be automatically refreshed, according to one embodiment of the invention. In one embodiment, the system 100 comprises a system on chip (SOC) 114 including a memory controller 103, with a refresh logic unit 105 which is operable to automatically refresh data in the data locations of the non-volatile memory 104, and a processor 113 coupled to the memory controller 103. In one embodiment, the SOC 114 includes other components e.g., wireless antenna, memory, etc.

In one embodiment, the SOC 114 communicates with the host 101 via a Serial Advance Technology Attachment (SATA) input-output (I/O) bus_109. In one embodiment, the SOC 114 communicates with the host 101 via a Serially Attached Small System Computer (SAS) input-output (I/O) bus 109. In one embodiment, other types of buses can be used for 109 without changes the essence of the embodiments discussed herein.

In one embodiment, the SOC 114 and the non-volatile memory 104 is part of a solid state drive SSD 114. In such an embodiment, the SOC 114 is a SSD controller. In one embodiment, the SSD 114 is positioned inside a personal computer, a tablet, a smart phone a so referred to as a smart device), etc. In one embodiment, the memory controller 103 and/or the SOC 114 is a standalone integrated circuit coupled to the host 101 and the non-volatile memory 104. In other embodiments, the memory controller 103 and/or the SOC 114 is integrated in the host 101.

In one embodiment, the host 101 comprises a processor 110, a clock unit 111, and an operating system 102 executing by the processor 110 and which is operable to program the refresh time and the retention time limit associated with the non-volatile memory 104. In one embodiment, the processor in the host 101 is a micro-processor designed and manufactured by INTEL CORP. of Santa Clara, Calif. In other embodiments, other processors made and designed by other vendors may be used for the host 101. In one embodiment, the host 101 is one of a personal computer, server, client, laptop, smart-phone, smart device, and/or tablet, etc. In one embodiment, the clock unit 111 provides real time to the memory controller 103 to determine when to refresh the contents of the non-volatile memory 104. In one embodiment, the memory controller 103 is coupled to a system clock unit 115 to provide a time representing the time the SSD 112 is powered on.

So as not to obscure the embodiments of the invention, a single non-volatile memory 104 is illustrated. However, the embodiments of the invention also work with multiple non-volatile memories communicatively coupled to the memory controller 103. White the embodiments of the invention are described with respect to the memory controller 103 communicating with the host 101 and the non-volatile memory 104, it is understood that the embodiments of the invention also operate with the SOC 114 communicating with the host 101 and the non-volatile memory 104.

In one embodiment, the non-volatile memory 104 is partitioned into units comprising units 106, 107, and 108. In one embodiment, the partitioned units 106, 107, and 108 are logical partitions distributed in the non-volatile memory 104. In one embodiment, the partitioned units 106, 107, and 108 are physical partitions. In one embodiment, partition unit 106 is configured to store new data in data locations. In one embodiment, partition unit 107 is the free space which is used for refreshing the data in partition unit 106 by relocating the data in partition unit 106 to partition unit 107. In one embodiment, partition unit 108 includes stored elapsed times associated with data (and/or data locations) in the partition units 106 and 107.

In one embodiment, the non-volatile memory 104 is a random-access non-volatile memory (NVRAM). In one embodiment, the non-volatile memory 104 is part of a solid-state drive (SSD). In one embodiment the non-volatile memory 104 is a NAND flash memory. In one embodiment the non-volatile memory 104 is a NOR flash memory. In one embodiment, the non-volatile memory 104 is one of a phase change memory (PCM), stacked PCM (PCMS, also referred to as PCM and switch), read-only memory (ROM), electrically erasable programmable read-only memory (EEPROM), or any other type of non-volatile memory device. In one embodiment, the non-volatile memory 104 is a removable drive e.g., a Universal Serial Bus (USB) memory stick, flash card, etc.

In one embodiment, the refresh logic unit 105 (and/or other units discussed with reference to FIG. 2) of the memory controller 103 is operable to automatically refresh data in the data locations of partition unit 106 of the non-volatile memory 104. In one embodiment, the memory controller 103 loads the time stamps from the partition unit 108 of the non-volatile memory 104 when the non-volatile memory 104 is powered-up and determines elapsed time from the time stamps and the current time.

In one embodiment, the memory controller 103 compares the elapsed times 108 for each data (or data location) in the partition unit 106 with the refresh time associated with the non-volatile memory 104. In one embodiment, when the memory controller 103 determines that the elapsed time is greater than the refresh time for a data (or data location) in the partition unit 106, then the memory controller 103 refreshes the data in partition unit 106. In one embodiment, the memory controller 103 refreshes the data in the partition unit 106 by relocating the data in the partition unit 106 to the partition unit 107.

In one embodiment, the memory controller 103 is operable to reset the elapsed time associated with the data location of the original data in partition unit 106, and to track the elapsed time of the data (of the data location) in the new (free) partition unit 107. In one embodiment, the memory controller 103 is operable to erase the original data location in partition unit 106 after the memory controller 103 refreshes the data in that location i.e., relocates the data to partition unit 107. In one embodiment, the memory controller 103 logically appends the original data location in partition unit 106 to the partition unit 107 because the original data location is now free after the data in it is refreshed.

In one embodiment, the memory controller 103 also tracks the elapsed time of the refreshed data in the new (free) partition unit 107 and relocates the data again in a free space of the partition unit 107 when the memory controller 103 determines that the elapsed time of the refreshed data in the new (free) partition unit 107 exceeds a refresh time associated with the non-volatile memory 104.

In one embodiment, the refresh time is less than the retention time limit associated with the non-volatile memory to accommodate/compensate for latencies inherent in the system 100 and to provide a margin in refreshing data before the retention time limit for the data (or data location) is reached. In one embodiment, the refresh time is programmable, in one embodiment, the refresh time is programmable by means of the operating system 102. In one embodiment, the refresh time is programmed to be equal to the retention time limit associated with the non-volatile memory.

Figure 2:
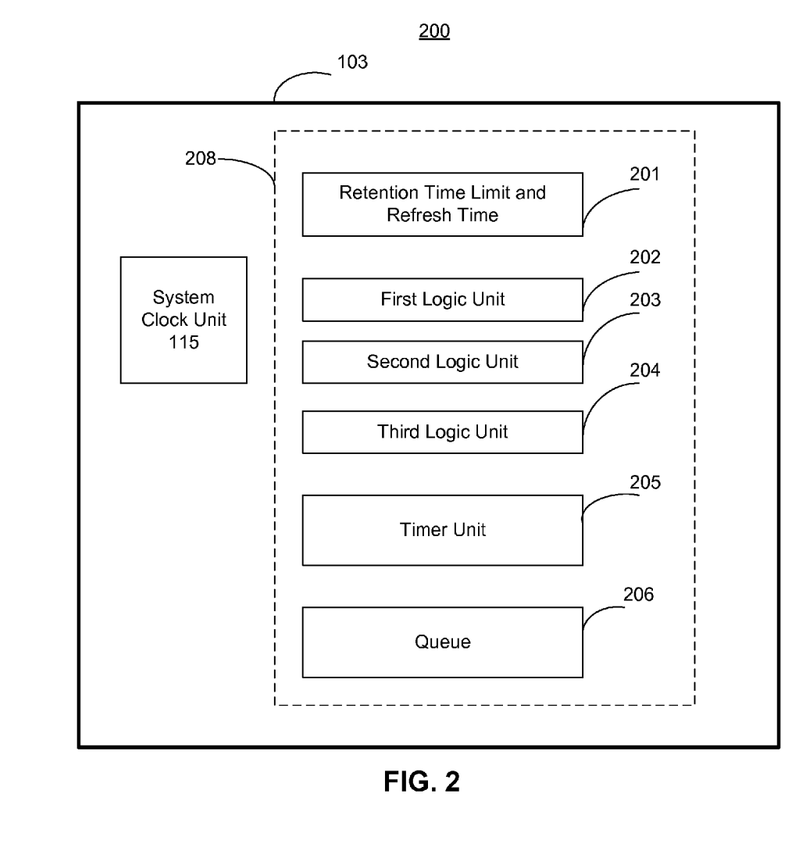
FIG. 2 are logic units of a memory controller which is operable to refresh the non-volatile memory, according to one embodiment of the invention.

FIG. 2 are logic units of a memory controller 200 which is operable to refresh the non-volatile memory 104, according to one embodiment of the invention. In one embodiment, the memory controller 200 is the same as the memory controller 103 of FIG. 1. Referring back to FIG. 2, in one embodiment the memory controller 103/200 comprises a processor 208 having logic units to refresh the non-volatile memory 104. In other embodiments, the memory controller 103/200 is coupled to the processor 113 of FIG. 1. In one embodiment, the logic units 201-207 are positioned inside the memory controller 103/200. In other embodiments, some or all of the logic units 201-207 are positioned inside the memory controller 103/200 and the processor 113. In one embodiment, the logic units 201-207 are positioned inside the SOC 114.

In one embodiment, the processor 208 includes a first logic unit 202 to load a time stamp from the partition unit 108, corresponding to data in a data location 106 of the non-volatile memory 104, to a register (not shown) in the first logic unit 202. In one embodiment, the memory controller 103/200 comprises a second logic unit 203 to determine an elapsed time, corresponding to the data in the data location 106, according to the loaded time stamp and/or the current time. In one embodiment, the second logic unit 203 determines the current time from system clock unit 115. In one embodiment, the second logic unit 203 determines the current time from a real-time clock generated by the clock unit 111 in the host 101. In one embodiment, the second logic unit 203 is operable to refresh the data location by relocating data from the data location in the partition unit 106 to the new (free) data location in partition unit 107, the relocating being independent of any host request.

In one embodiment, the memory controller 103/200 comprises a refresh logic unit 201 (same as logic unit 105 of FIG. 1) to refresh data. In one embodiment, the refresh logic unit 201 is operable to refresh data of the data location for which the refresh logic unit 201 determines that the elapsed time exceeds a refresh time associated with the non-volatile memory 104, wherein the elapsed time represents duration from a time data is written to the non-volatile memory 104 to a time the non-volatile memory 104 is powered down or data is erased from the data location, and wherein the refresh time associated with the non-volatile memory 104 is less than or equal to the retention time limit associated with the non-volatile memory 104.

In one embodiment, the elapsed time comprises time accumulated upon every power-up event to every power-down event of the non-volatile memory 104. In one embodiment, the refresh logic unit 201 is operable to update, over time, the retention time limit associated with the non-volatile memory 104 by reducing the retention time limit. One reason for reducing the retention time limit is that as the non-volatile memory 104 ages in time or the number of program erase cycles increase, the non-volatile memory 104 has reduced capacity to retain data in idle state i.e., the retention time limit reduces over time. In such an embodiment, the refresh logic unit 201 is operable to modify the refresh time in response to updating the retention time limit by reducing the refresh time. In one embodiment, the refresh time is reduced regardless of reducing the retention time limit to provide more timing margin for refreshing data and to avoid reaching the retention time limit for a data in a data location.

In one embodiment, the memory controller 103/200 comprises a timer unit 205 to modify the elapsed time when it is determined that the elapsed time is less than the refresh time. In one embodiment, the tinier unit 205 is operable to reset the elapsed time, corresponding to the new (free) data location in the partition unit 107, after data is relocated from a data location in partition unit 106 to partition unit 107. In one embodiment, the timer unit 205 comprises a counter which increments the elapsed time on every clock cycle corresponding to the system clock or real-time clock. In one embodiment, the memory controller 103/200 comprises a third logic unit 204 to store the modified elapsed time.

In one embodiment, the memory controller 103/200 comprises a queue 206 to store a pointer to the data cation in partition unit 106 containing the data prior to refreshing the data in the data location in the partition unit 106. In one embodiment, the memory controller 103/200 comprises one or more registers to store the retention time limit and refresh time associated with the non-volatile memory 104. In one embodiment, the refresh time is less than the retention time limit by an amount equal to or greater than the maximum latency of the queue 206. In one embodiment, the queue 206 is a chain of shift registers (not shown).

In one embodiment, the memory controller 103/200 refreshes the data in the non-volatile memory 104 only when the host 101 is idle. The term "idle" herein refers to no requests being made by the host 101 to the non-volatile memory 104 via the memory controller 103. In one embodiment, the host 101 is given priority over any refresh mechanism discussed here i.e., if the host 101 makes a read request to the memory controller 103/200, the automatic refresh operation discussed herein is queued till the read request is complete. In one embodiment, the automatic refresh operation discussed herein is queued when the host 101 makes a write request to the memory controller 103/200. In one embodiment, the priority level of the automatic refresh operation, relative to priority levels of other operations to the non-volatile memory 104, is programmable by the operating system 102.

Figure 3:
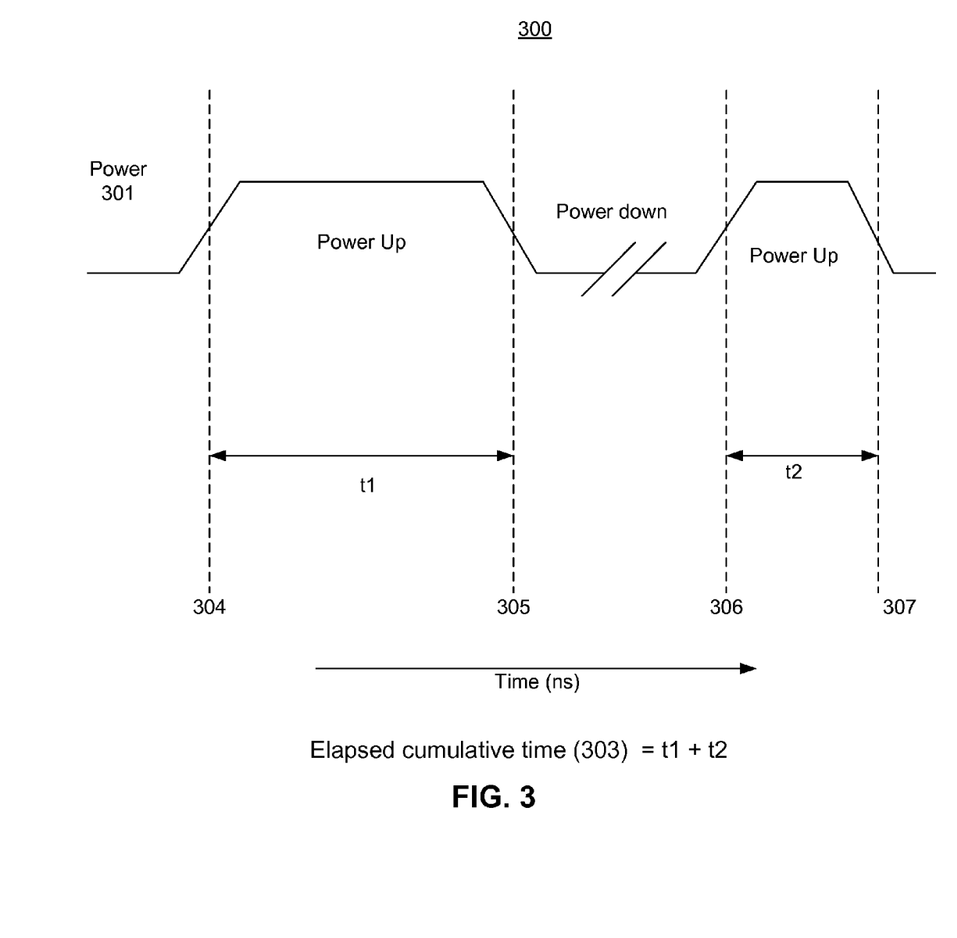
FIG. 3 is a timing diagram to illustrate how elapsed time is determined by the memory controller to refresh the non-volatile memory, according to one embodiment of the invention.

FIG. 3 is a timing diagram 300 to illustrate how elapsed time is determined by the memory controller 103/200 to refresh the non-volatile memory 104, according to one embodiment of the invention. In one embodiment, the elapsed time is a cumulative time representing the duration of power on time of the non-volatile memory 104. The waveform 300 is illustrated with the assumption that data is written to a data location in the non-volatile memory 104 at time post 304. The waveforms 300 illustrate a power indicator signal 301 which is asserted between time posts 304 and 305 (i.e., t1), and again from 306 to 307 (i.e., t2). In this example, the elapsed time 303 is the sum of t1 and t2 of waveform 301. In one embodiment, the elapsed time 303 is determined by the second logic unit 203.

Figure 4:
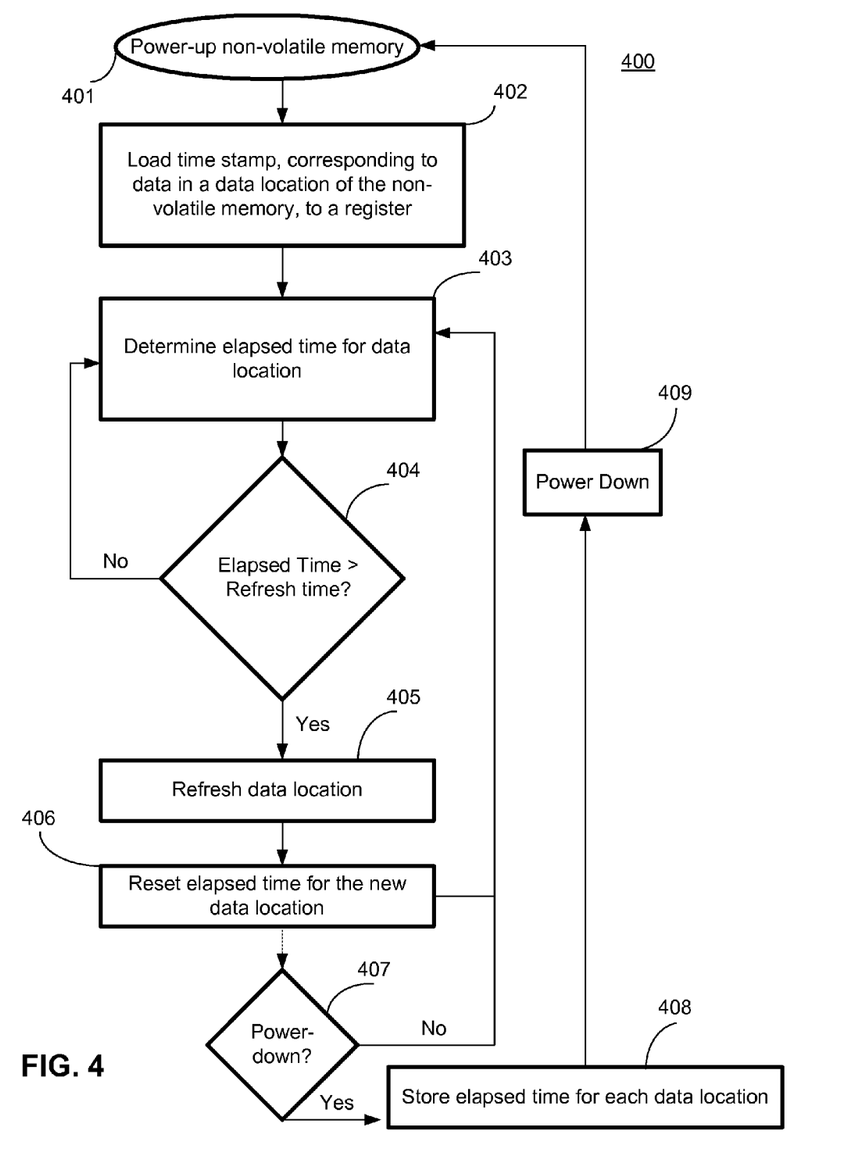
FIG. 4 is a flowchart which is operable to refresh the non-volatile memory, according to one embodiment of the invention.

FIG. 4 is a flow chart 400 which is operable to refresh the non-volatile memory 104, according to one embodiment of the invention. Although the blocks in the flowchart 400 are shown in a particular order, the order of the actions can be modified. Thus, the illustrated embodiments can be performed in a different order, and some actions/blocks may be performed in parallel. Additionally, one or more actions/blocks can be omitted in various embodiments of refreshing the non-volatile memory 104. The flow chart of FIG. 4 is illustrated with reference to the embodiments of FIG. 1-3.

At block 401, the non-volatile memory 104 is powered on. At block 402, in response to powering on the non-volatile memory 104, the first logic unit 202 of the memory controller 103/200 toads time stamps from the partition unit 108, corresponding to data in data locations in partition unit 106 of the non-volatile memory 104, to one or more registers (not shown). At block 403, the second logic unit 203 determines the elapsed time for the data locations according to the located time stamps and the current time.

As mentioned above, elapsed time refers to the cumulative time, associated with a data (or data location) on the non-volatile memory 104, which includes the time from when the data is written to the non-volatile memory 104 to the time the non-volatile memory powers down (at block 409) or if the data is erased before the non-volatile memory is powered down. The elapsed time also includes time, associated with the data (or data location), accumulated upon every power-up event to every power-down event of the non-volatile memory. In one embodiment, the memory controller 103/200 tracks the elapsed time for each data location in the partition unit 106 of the non-volatile memory 104 to identify how long the data has been stored in the data location of the partition unit 106.

At block 404 the elapsed time (cumulative) is compared with the refresh time. When the elapsed time becomes greater than the refresh time associated with the non-volatile memory 104, then the refresh logic unit 201 of the memory controller 103/200 refreshes the data at block 405. If the elapsed time is less than the refresh time associated with the non-volatile memory 104, then the elapsed time is updated/modified by the timer unit 205. In one embodiment, the elapsed times are stored in the partition unit 108. In one embodiment, the elapsed time is incremented as the system clock increments. In one embodiment, the elapsed time is incremented as the real-time clock increments.

At block 406, the elapsed time is reset for the data location in partition unit 106 that was refreshed at block 405. In one embodiment, the reset operation zeros the elapsed time associated with the data location in partition unit 106. In one embodiment, the elapsed time begins to increment again once new data is stored/written. In the data location of 106. In the above embodiment, the elapsed time for the new (free) data location in partition unit 107 is also reset because it now stores the data relocated from partition unit 106. In one embodiment, the data location in partition unit 107, which now contains the data refreshed/relocated from partition unit 106, is no longer free (because it now contains data) and so is part of partition 106 instead of partition 107. In one embodiment, the elapsed times of all the data locations of partition unit 106 are stored in the partition unit 108 of the non-volatile memory 104 at regular intervals.

At block 406, after the elapsed time is reset for the data location in partition unit 106, the data location of the partition unit 106 becomes free because data in it got relocated to a free space in partition unit 107. In such an embodiment, the data location in partition unit 106, which is now free, becomes part of the free space of partition unit 107 while the data location which now contains new data relocated to its location becomes part of the partition unit 106. In one embodiment, after the operation of the block 406 completes, the process is repeated at block 403 for another data location in partition unit 106. The process identified by blocks 403 to 406 is repeated for all data locations in the partition unit 106 of the non-volatile memory 104. Accordingly, all data locations for which the elapsed time exceeds the refresh time are refreshed. In one embodiment, the data in the partition unit 106 for which the elapsed time exceeds the refresh time are relocated to the partition unit 107. In one embodiment, the data in the partition unit 107 for which the elapsed time exceeds the refresh time are relocated to another free region in the same partition unit 107.

While the flow chart 400 is shown as a sequence, the blocks may be executed in parallel, according to one embodiment of the invention. In such an embodiment, blocks 403 to 406 are executed in parallel for multiple data locations of the non-volatile memory 104.

At block 407, a determination is made whether the non-volatile memory 104 is being powered down. In one embodiment, block 407 is executed at any time in the flow chart. 400, in one embodiment, block 407 is executed at regular periodic intervals i.e., at a fixed frequency. In one embodiment, block 407 is executed after executing each block in the flow chart 400. If a determination is made, by the refresh logic unit 201, that the non-volatile memory 104 is being powered down, then at block 408 all determined elapsed times for data locations in partition unit 106 are stored in the partition unit 108. At block 409, the non-volatile memory is powered down. In one embodiment, the time stamps (stored elapsed times in partition unit 108) are reloaded at block 402 after the non-volatile memory is powered back up at block 401. If a determination is made at block 407 that the nonvolatile memory 104 is not being powered down, then the process of automatic refreshing of data continues from block 403.

Figure 5:
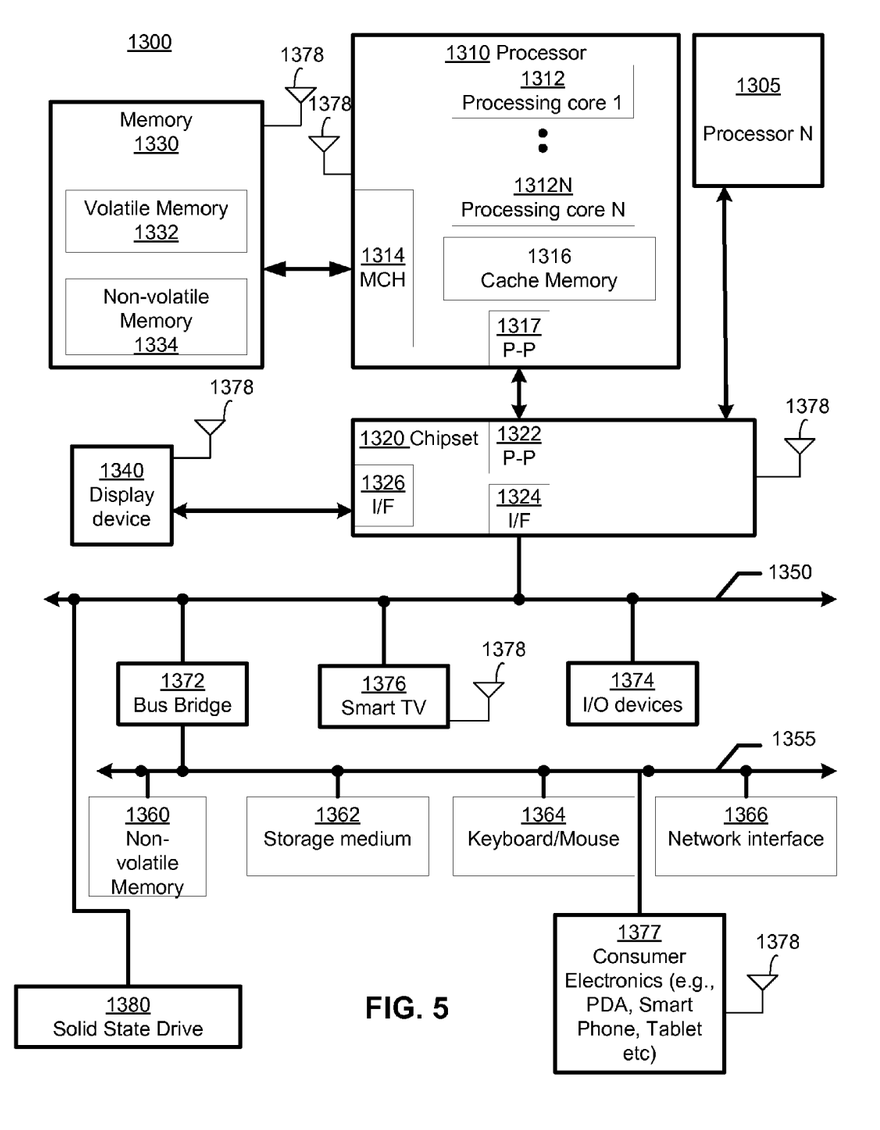
FIG. 5 is a system level diagram comprising a processor and/or memory controller to refresh the non-volatile memory, according to one embodiment of the invention.

FIG. 5 is a system level diagram comprising a processor and/or memory controller to refresh the non-volatile memory, according to one embodiment of the invention. FIG. 5 also includes a machine-readable storage medium to execute computer readable instructions to perform the methods of various embodiments. Elements of embodiments are also provided as a machine-readable medium for storing the computer-executable instructions (e.g., instructions to implement the flowchart of FIG. 4). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 is operable to communicate with the memory 1330 and a chipset 1320. In one embodiment, the processor 1310 (same as 110 of FIG. 1) and the chipset 1320 are part of the host 101 of FIG. 1. In one embodiment, the chipset 1320 is coupled to a SSD 1380 (same as 112 of FIG. 1) via a SATA bus 1350 (same as bus 109 of FIG. 1). In one embodiment, the SSD 1380 includes machine-readable medium for storing the computer-executable instructions to implement the flowchart of FIG. 4. In such an embodiment, the SSD 1380 executes the computer-executable instructions when the SSD 1380 is powered up.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via. Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display LCD), plasma, cathode ray tube (CRT) display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, anon-volatile memory 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 5 are depicted as separate Hocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, in one embodiment a user or the host system initiates the refresh process. In one embodiment, the refresh process is initiated (either by the memory controller 103 or the host system or user) in response to certain reliability parameters tracked by the memory controller 103 or the host system. The term "reliability parameters" herein refers to reliability of the transistors (e.g., transistor gate oxide degradation, electro-migration of interconnects, etc.) of the non-volatile memory 104. In one embodiment, the memory controller 103 tracks the elapsed time and compares it with the refresh time to determine when to initiate a refresh, and also tracks the reliability parameters associated with the non-volatile memory to determine when to initiate a refresh of the non-volatile memory. In one embodiment, if the elapsed time exceeds the refresh time or the reliability parameters indicate a degrading non-volatile memory, then the process of refresh is initiated.

The embodiments of the invention are intended to embrace all such alternatives, modifications, and variations as to fall within the broad scope of the appended claims.

We claim:

1. A method comprising:
   storing a time stamp corresponding to data of a data location to a memory location in a non-volatile memory when the non-volatile memory is powered down;
   loading the time stamp to a register;
   determining an elapsed time, corresponding to the data in the data location, according to the loaded time stamp, wherein the elapsed time is cumulative time from when the data is written to the data location to a time when the non-volatile memory powers down; and
   refreshing data of the data location for which it is determined that the elapsed time exceeds a refresh time associated with the non-volatile memory, wherein the refresh time associated with the non-volatile memory is less than or equal to a retention time limit associated with the non-volatile memory.

2. The method of claim 1 further comprises determining the retention time limit associated with the non-volatile memory by determining when data in the data location of the non-volatile memory corrupts for an operating voltage, temperature, and process technology of the non-volatile memory.

3. The method of claim 2 further comprises:
   updating, over time, the retention time limit associated with the non-volatile memory by reducing the determined retention time limit; and
   modifying the refresh time in response to updating the retention time limit.

4. The method of claim 1 further comprises:
   modifying the elapsed time when it is determined that the elapsed time is less than the refresh time; and
   storing the modified elapsed time.

5. The method of claim 4, wherein modifying the elapsed time comprises incrementing the elapsed time with a clock signal.

6. The method of claim 1, wherein refreshing the data in the data location comprises relocating the data in the data location to a new data location independent of any host request.

7. The method of claim 6 further comprises resetting elapsed time corresponding to the new data location.

8. The method of claim 6, wherein relocating data comprises queuing a pointer to the data location prior to storing the data in the new data location.

9. The method of claim 1, wherein the non-volatile memory is one of a NAND flash memory or a NOR flash memory.

10. The method of claim 1, wherein the refresh time is programmable.

11. The method of claim 1, wherein loading the time stamp is performed after powering up the non-volatile memory.

12. A system comprising:
    a display; and
    a solid state drive (SSD), coupled to the display, the SSD comprising:
    a memory controller, coupled to a non-volatile memory, operable to:
       store a time stamp corresponding to data of a data location to a memory location in a non-volatile memory when the non-volatile memory is powered down;
       load the time stamp to a register;
       determine an elapsed time, corresponding to the data in the data location, according to the loaded time stamp, wherein the elapsed time is cumulative time from when the data is written to the data location to a time when the non-volatile memory powers down or to a time when data; and
       refresh data of the data location for which it is determined that the elapsed time exceeds a refresh time associated with the non-volatile memory, wherein the refresh time associated with the non-volatile memory is less than or equal to a retention time limit associated with the non-volatile memory.

13. The system of claim 12, wherein the memory controller is operable to:
    update, over time, the retention time limit associated with the non-volatile memory by reducing the retention time limit; and
    modify the refresh time in response to updating the retention time limit.

14. The system of claim 12, wherein the memory controller is operable to:
    modify the elapsed time when it is determined that the elapsed time is less than the refresh time; and
    store the modified elapsed time.

15. The system of claim 14, wherein the memory controller comprises a timer unit to modify the elapsed time by incrementing the elapsed time with a clock signal.

16. The system of claim 12, wherein the memory controller is operable to refresh the data in the location by relocating the data from the data location to a new data location independent of any host request and wherein the memory controller is operable to reset the timer unit to reset elapsed time corresponding to the new data location.

17. The system of claim 12, wherein the memory controller comprises a queue to store a pointer to the data location containing the data prior to refreshing the data in the data location.

18. The system of claim 12, wherein the non-volatile memory is one of a NAND flash memory or a NOR flash memory.

19. The system of claim 12 further comprises:
an antenna; and
a radio-frequency circuitry coupled to the antenna to receive signal data to be stored on the non-volatile memory.

20. A non-transitory machine readable storage medium having instructions stored thereon that when executed by a machine, the machine to perform a method comprising:
storing a time stamp corresponding to data of a data location to a memory location in a non-volatile memory when the non-volatile memory is powered down;
loading the time stamp to a register;
determining an elapsed time, corresponding to the data in the data location, according to the loaded time stamp, wherein the elapsed time is cumulative time from when the data is written to the data location to a time when the non-volatile memory powers down; and
refreshing data of the data location for which it is determined that the elapsed time exceeds a refresh time associated with the non-volatile memory, wherein the refresh time associated with the non-volatile memory is less than or equal to a retention time limit associated with the non-volatile memory.

21. The non-transitory machine readable storage medium of claim 20 having further instructions that when executed cause the machine to perform a further method comprising:
determining the retention time limit associated with the non-volatile memory by determining when data in the data location of the non-volatile memory corrupts for an operating voltage, temperature, and process technology of the non-volatile memory.

22. The non-transitory machine readable storage medium of claim 21 having further instructions that when executed cause the machine to perform a further method comprising:
updating, over time, the retention time limit associated with the non-volatile memory by reducing the determined retention time limit; and
modifying the refresh time in response to updating the retention time limit.

23. The non-transitory machine readable storage medium of claim 20 having further instructions that when executed cause the machine to perform a further method comprising:
modifying the elapsed time when it is determined that the elapsed time is less than the refresh time; and
storing the modified elapsed time.

* * * * *